(12) United States Patent
Moloney

(10) Patent No.: US 10,719,318 B2
(45) Date of Patent: Jul. 21, 2020

(54) PROCESSOR

(71) Applicant: MOVIDIUS LIMITED, Schiphol-Rijk (NL)

(72) Inventor: David Moloney, Dublin (IE)

(73) Assignee: Movidius Limited, Schiphol-Rijk (NL)

( * ) Notice: Subject to any disclaimer, the term of this patent is extended or adjusted under 35 U.S.C. 154(b) by 0 days.

(21) Appl. No.: 15/855,661

(22) Filed: Dec. 27, 2017

(65) Prior Publication Data

US 2018/0189066 A1 Jul. 5, 2018

Related U.S. Application Data

(63) Continuation of application No. 12/867,095, filed as application No. PCT/EP2009/051598 on Feb. 11, 2009, now Pat. No. 9,858,073.

(30) Foreign Application Priority Data

Feb. 11, 2009 (GB) .................................. 0802484.6

(51) Int. Cl.
*G06F 9/00* (2006.01)
*G06F 9/30* (2018.01)
*G06F 9/38* (2018.01)
*G06F 12/02* (2006.01)
*H03M 7/30* (2006.01)

(52) U.S. Cl.
CPC ........ *G06F 9/30043* (2013.01); *G06F 9/3824* (2013.01); *G06F 12/02* (2013.01); *H03M 7/3066* (2013.01); *G06F 2212/401* (2013.01)

(58) Field of Classification Search
None
See application file for complete search history.

(56) References Cited

U.S. PATENT DOCUMENTS

| 4,125,873 | A | | 11/1978 | Chesarek |
| 4,439,828 | A | * | 3/1984 | Martin .................. G06F 9/3017 712/226 |
| 4,606,002 | A | | 8/1986 | Waisman et al. |
| 5,153,591 | A | | 10/1992 | Clark |
| 5,247,638 | A | | 9/1993 | O'Brien et al. |
| 5,394,534 | A | | 2/1995 | Kulakowski et al. |
| 5,805,735 | A | | 9/1998 | Chen et al. |
| 5,960,465 | A | | 9/1999 | Adams |
| 6,145,069 | A | | 11/2000 | Dye |

(Continued)

FOREIGN PATENT DOCUMENTS

| CA | 2564844 | 11/2005 |
| GB | 2447494 | 9/2008 |

(Continued)

OTHER PUBLICATIONS

Abadi et al. "Integrating Compression and Execution in Column-Oriented Database Systems." 2006, 12 pages.

(Continued)

*Primary Examiner* — David Yi
*Assistant Examiner* — Craig S Goldschmidt
(74) *Attorney, Agent, or Firm* — Hanley, Flight & Zimmerman, LLC

(57) ABSTRACT

The present application provides a method of randomly accessing a compressed structure in memory without the need for retrieving and decompressing the entire compressed structure.

23 Claims, 20 Drawing Sheets

(56) References Cited

U.S. PATENT DOCUMENTS

| | | | |
|---|---|---|---|
| 6,243,081 B1 | 6/2001 | Goris et al. | |
| 6,442,085 B1* | 8/2002 | Fragano | G11C 29/02 365/189.08 |
| 6,564,305 B1* | 5/2003 | Moore | G06F 12/08 358/1.15 |
| 6,591,019 B1* | 7/2003 | Comair | G06T 9/005 345/419 |
| 2007/0112795 A1* | 5/2007 | Travison, Jr. | G06F 16/2255 |
| 2010/0057697 A1 | 3/2010 | Golwalkar et al. | |
| 2011/0047360 A1 | 2/2011 | Maloney | |

FOREIGN PATENT DOCUMENTS

| | | |
|---|---|---|
| WO | 0143074 | 6/2001 |
| WO | 2009101119 | 8/2009 |

OTHER PUBLICATIONS

Brittish Patent Office, "Search Report", issued in connection with British patent application No. GB0704976.0, dated Jul. 26, 2007, 7 pages.

International Searching Authority, "Search Report", issued in connection with PCT patent application No. PCT/EP2009/051598, dated May 25, 2009, 3 pages.

International Searching Authority, "Written Opinion", issued in connection with PCT patent application No. PCT/EP2009/051598, dated Jun. 4, 2009, 6 pages.

International Bureau, "International Preliminary Report on Patentability", issued in connection with PCT patent application No. PCT/EP2009/051598, dated Jun. 4, 2009, 7 pages.

European Patent Office, "Communication pursuant to Article 94(3)", issued in connection with European patent application No. 09 709 874.3, dated Oct. 4, 2012, 5 pages.

Japanese Patent Office, "Office action", issued in connection with Japanese patent application No. 2010-545506, dated Aug. 27, 2013, 12 pages.

United States Patent and Trademark Office, "Notice of Allowance", issued in connection with U.S. Appl. No. 12/867,095, dated Jun. 29, 2017, 18 pages.

United States Patent and Trademark Office, "Decision on Appeal", issued in connection with U.S. Appl. No. 12/867,095, dated Apr. 4, 2017, 10 pages.

United States Patent and Trademark Office, "Examiner's Answer to Appeal Brief", issued in connection with U.S. Appl. No. 12/867,095, dated Jun. 16, 2016, 26 pages.

United States Patent and Trademark Office, "Final Office action", issued in connection with U.S. Appl. No. 12/867,095, dated Jun. 4, 2015, 27 pages.

United States Patent and Trademark Office, "Non-Final Office action", issued in connection with U.S. Appl. No. 12/867,095, dated Dec. 5, 2014, 35 pages.

United States Patent and Trademark Office, "Final Office action", issued in connection with U.S. Appl. No. 12/867,095, dated May 22, 2014, 31 pages.

United States Patent and Trademark Office, "Non-Final Office action", issued in connection with U.S. Appl. No. 12/867,095, dated Dec. 24, 2013, 31 pages.

* cited by examiner $$S(s_x, s_y, s_z) = \begin{bmatrix} s_x & 0 & 0 & 0 \\ 0 & s_y & 0 & 0 \\ 0 & 0 & s_z & 0 \\ 0 & 0 & 0 & 1 \end{bmatrix}$$

scaling matrix $$T(d_x, d_y, d_z) = \begin{bmatrix} 1 & 0 & 0 & d_x \\ 0 & 1 & 0 & d_y \\ 0 & 0 & 1 & d_z \\ 0 & 0 & 0 & 1 \end{bmatrix}$$

translation matrix $$R_x(\theta) = \begin{bmatrix} 1 & 0 & 0 & 0 \\ 0 & \cos\theta & -\sin\theta & 0 \\ 0 & \sin\theta & \cos\theta & 0 \\ 0 & 0 & 0 & 1 \end{bmatrix}$$

x-axis rotation matrix $$R_y(\theta) = \begin{bmatrix} \cos\theta & 0 & \sin\theta & 0 \\ 0 & 1 & 0 & 0 \\ -\sin\theta & 0 & \cos\theta & 0 \\ 0 & 0 & 0 & 1 \end{bmatrix}$$

y-axis rotation matrix $$R_z(\theta) = \begin{bmatrix} \cos\theta & -\sin\theta & 0 & 0 \\ \sin\theta & \cos\theta & 0 & 0 \\ 0 & 0 & 1 & 0 \\ 0 & 0 & 0 & 1 \end{bmatrix}$$

z-axis rotation matrix $$SH_{xy}(sh_x, sh_y) = \begin{bmatrix} 1 & 0 & sh_x & 0 \\ 0 & 1 & sh_y & 0 \\ 0 & 0 & 1 & 0 \\ 0 & 0 & 0 & 1 \end{bmatrix}$$

xy shear matrix $$SH_{xz}(sh_x, sh_z) = \begin{bmatrix} 1 & sh_x & 0 & 0 \\ 0 & 1 & 0 & 0 \\ 0 & sh_z & 1 & 0 \\ 0 & 0 & 0 & 1 \end{bmatrix}$$

xz shear matrix $$SH_{yz}(sh_y, sh_z) = \begin{bmatrix} 1 & 0 & 0 & 0 \\ sh_y & 1 & 0 & 0 \\ sh_z & 0 & 1 & 0 \\ 0 & 0 & 0 & 1 \end{bmatrix}$$

yz shear matrix

Figure 2

4x4 matrix data

|   | 0 | 1 | 2 | 3 |
|---|---|---|---|---|
|   | 1.0 | 2.0 | 3.0 | 4.0 |
|   | 0.0 | 6.0 | 0.0 | 0.0 |
|   | 0.0 | 0.0 | 0.0 | 12.0 |
|   | 13.0 | 14.0 | 0.0 | 16.0 | bitmap

| 1 | 1 | 1 | 1 |
|---|---|---|---|
| 0 | 1 | 0 | 0 |
| 0 | 0 | 0 | 1 |
| 1 | 1 | 0 | 1 |

*16 bits stored as 32-bit entry*

|  | IEEE prec. | storage bits |
|---|---|---|
| original data with fill | 32 | 128 |
|  | 32 | 128 |
|  | 32 | 128 |
|  | 32 | 128 |
| total |  | 512 |

|  | | |
|---|---|---|
| compressed with bitmap | 32 | 128 |
|  | 32 | 32 |
|  | 32 | 32 |
|  | 32 | 96 |
| total |  | 320 |

| compression | 37.5% |
|---|---| uncomp. memory

| 1.0 |
|---|
| 2.0 |
| 3.0 |
| 4.0 |
| 0.0 |
| 6.0 |
| 0.0 |
| 0.0 |
| 0.0 |
| 0.0 |
| 12.0 |
| 13.0 |
| 14.0 |
| 0.0 |
| 16.0 |

16x32 comp. memory

| 1.0 |
|---|
| 2.0 |
| 3.0 |
| 4.0 |
| 6.0 |
| 12.0 |
| 13.0 |
| 14.0 |
| 16.0 |
| 1111010000011101 |

| f7 | f6 | f5 | f4 | f3 | f2 | f1 | f0 | fen[2:0] sequence | | | | | | |
|----|----|----|----|----|----|----|----|---|---|---|---|---|---|---|
| 0 | 0 | 0 | 0 | 0 | 0 | 0 | 0 | | | | | | | |
| 0 | 0 | 0 | 0 | 0 | 0 | 0 | 1 | 0 | | | | | | |
| 0 | 0 | 0 | 0 | 0 | 0 | 1 | 0 | 1 | | | | | | |
| 0 | 0 | 0 | 0 | 0 | 0 | 1 | 1 | 0 | 1 | | | | | |
| 0 | 0 | 0 | 0 | 0 | 1 | 0 | 0 | 2 | | | | | | |
| 0 | 0 | 0 | 0 | 0 | 1 | 0 | 1 | 0 | 2 | | | | | |
| 0 | 0 | 0 | 0 | 0 | 1 | 1 | 0 | 1 | 2 | | | | | |
| 0 | 0 | 0 | 0 | 0 | 1 | 1 | 1 | 0 | 1 | 2 | | | | |
| 0 | 0 | 0 | 0 | 1 | 0 | 0 | 0 | 3 | | | | | | |
| 0 | 0 | 0 | 0 | 1 | 0 | 0 | 1 | 0 | 3 | | | | | |
| 0 | 0 | 0 | 0 | 1 | 0 | 1 | 0 | 1 | 3 | | | | | |
| 0 | 0 | 0 | 0 | 1 | 0 | 1 | 1 | 0 | 1 | 3 | | | | |
| 0 | 0 | 0 | 0 | 1 | 1 | 0 | 0 | 2 | 3 | | | | | |
| 0 | 0 | 0 | 0 | 1 | 1 | 0 | 1 | 0 | 2 | 3 | | | | |
| 0 | 0 | 0 | 0 | 1 | 1 | 1 | 0 | 1 | 2 | 3 | | | | |
| 0 | 0 | 0 | 0 | 1 | 1 | 1 | 1 | 0 | 1 | 2 | 3 | | | |
| 0 | 0 | 0 | 1 | 0 | 0 | 0 | 0 | 4 | | | | | | |
| 0 | 0 | 0 | 1 | 0 | 0 | 0 | 1 | 0 | 4 | | | | | |
| 0 | 0 | 0 | 1 | 0 | 0 | 1 | 0 | 1 | 4 | | | | | |
| 0 | 0 | 0 | 1 | 0 | 0 | 1 | 1 | 0 | 1 | 4 | | | | |
| 0 | 0 | 0 | 1 | 0 | 1 | 0 | 0 | 2 | 4 | | | | | |
| 0 | 0 | 0 | 1 | 0 | 1 | 0 | 1 | 0 | 2 | 4 | | | | |
| 0 | 0 | 0 | 1 | 0 | 1 | 1 | 0 | 1 | 2 | 4 | | | | |
| 0 | 0 | 0 | 1 | 0 | 1 | 1 | 1 | 0 | 1 | 2 | 4 | | | |
| 0 | 0 | 0 | 1 | 1 | 0 | 0 | 0 | 3 | 4 | | | | | |
| 0 | 0 | 0 | 1 | 1 | 0 | 0 | 1 | 0 | 3 | 4 | | | | |
| 0 | 0 | 0 | 1 | 1 | 0 | 1 | 0 | 1 | 3 | 4 | | | | |
| 0 | 0 | 0 | 1 | 1 | 0 | 1 | 1 | 0 | 1 | 3 | 4 | | | |
| 0 | 0 | 0 | 1 | 1 | 1 | 0 | 0 | 2 | 3 | 4 | | | | |
| 0 | 0 | 0 | 1 | 1 | 1 | 0 | 1 | 0 | 2 | 3 | 4 | | | |
| 0 | 0 | 0 | 1 | 1 | 1 | 1 | 0 | 1 | 2 | 3 | 4 | | | |
| 0 | 0 | 0 | 1 | 1 | 1 | 1 | 1 | 0 | 1 | 2 | 3 | 4 | | |
| ⋮ | ⋮ | ⋮ | ⋮ | ⋮ | ⋮ | ⋮ | ⋮ | ⋮ | ⋮ | ⋮ | ⋮ | ⋮ | ⋮ | ⋮ |
| 1 | 1 | 1 | 1 | 1 | 0 | 0 | 0 | 3 | 4 | 5 | 6 | 7 | | |
| 1 | 1 | 1 | 1 | 1 | 0 | 0 | 1 | 0 | 3 | 4 | 5 | 6 | 7 | |
| 1 | 1 | 1 | 1 | 1 | 0 | 1 | 0 | 1 | 3 | 4 | 5 | 6 | 7 | |
| 1 | 1 | 1 | 1 | 1 | 0 | 1 | 1 | 0 | 1 | 3 | 4 | 5 | 6 | 7 |
| 1 | 1 | 1 | 1 | 1 | 1 | 0 | 0 | 2 | 3 | 4 | 5 | 6 | 7 | |
| 1 | 1 | 1 | 1 | 1 | 1 | 0 | 1 | 0 | 2 | 3 | 4 | 5 | 6 | 7 |
| 1 | 1 | 1 | 1 | 1 | 1 | 1 | 0 | 1 | 2 | 3 | 4 | 5 | 6 | 7 |
| 1 | 1 | 1 | 1 | 1 | 1 | 1 | 1 | 0 | 1 | 2 | 3 | 4 | 5 | 6 | 7 |

Figure 11

| bits | PEU | BRU | LSU1 | LSU2 | VAU<br>IAU1 | SAU<br>IAU0 | CMU |
|---|---|---|---|---|---|---|---|
| 127 | 9 | 11 | 24 | 24 | 22 | 21 | 16 |

LSU

| | op [24:22] | dst | base | index | offset |
|---|---|---|---|---|---|
| NOP | 0 0 0 | x | x | x | x |
| LDXV | 0 0 1 | vrf | irf(baseinc) | irf | fp \| lop \| 6-bit imm (signed) |
| STXV | 0 1 0 | vrf | irf(baseinc) | irf | fp \| lop \| 6-bit imm (signed) |
| LDCV | 0 1 1 | vrf | irf(baseinc) | irf(bitmap) | fp \| f7 \| f6 \| f5 \| f4 \| f3 \| f2 \| f1 \| f0 |
| STCV | 1 0 0 | vrf | irf(baseinc) | irf(bitmap) | fp \| f7 \| f6 \| f5 \| f4 \| f3 \| f2 \| f1 \| f0 |
| LDLI | 1 0 1 | irf | 16 bit imm | | |
| LDHI | 1 1 0 | irf | 16 bit imm | | |
| LDHF | 1 1 1 | vrf/irf | irf(baseinc) | irf | 0 \| 0 \| dst \| fp \| lop \| x |

| matrix | upper 16 bits are unused 0x000 | | | | | | | | | | | | | | | | nz | comp % |
|---|---|---|---|---|---|---|---|---|---|---|---|---|---|---|---|---|---|---|
| scaling | 1 | 0 | 0 | 0 | 0 | 0 | 1 | 0 | 0 | 0 | 0 | 0 | 1 | 0 | 0 | 1 | 4 | 68.8% |
| translation | 1 | 0 | 0 | 0 | 0 | 1 | 1 | 0 | 1 | 0 | 0 | 0 | 1 | 1 | 0 | 1 | 7 | 50.0% |
| x-axis rot. | 1 | 0 | 0 | 0 | 0 | 1 | 1 | 1 | 1 | 0 | 0 | 0 | 0 | 0 | 0 | 1 | 6 | 56.3% |
| y-axis rot. | 1 | 0 | 1 | 1 | 0 | 0 | 1 | 0 | 0 | 1 | 0 | 0 | 0 | 0 | 0 | 1 | 6 | 56.3% |
| z-axis rot. | 1 | 1 | 1 | 1 | 1 | 0 | 0 | 0 | 0 | 0 | 0 | 0 | 0 | 0 | 1 | 1 | 6 | 56.3% |
| xy shear | 1 | 0 | 1 | 0 | 1 | 0 | 0 | 0 | 0 | 0 | 1 | 0 | 1 | 0 | 0 | 1 | 6 | 56.3% |
| xz shear | 1 | 0 | 1 | 0 | 0 | 1 | 0 | 0 | 0 | 0 | 1 | 0 | 1 | 0 | 0 | 1 | 6 | 56.3% |
| yz shear | 1 | 0 | 1 | 0 | 0 | 0 | 0 | 1 | 0 | 0 | 1 | 1 | 0 | 0 | 0 | 1 | 6 | 56.3% |

Figure 18

PROCESSOR

CROSS-REFERENCE TO RELATED APPLICATIONS

This patent arises from a continuation U.S. Non-provisional patent application Ser. No. 12/867,095 (now U.S. Pat. No. 9,858,073), filed on Oct. 20, 2010, entitled "A PROCESSOR," which is a national phase submission pursuant to 35 U.S.C 371 of PCT Patent Application No. PCT/EP09/51598, filed on Feb. 11, 2009, entitled "A PROCESSOR," which claims priority to British Patent Application No. 0802484.6, filed on Feb. 11, 2008, the contents of the aforementioned applications are expressly incorporated by reference herein in their entireties for all purposes.

FIELD OF THE DISCLOSURE

The present application relates to the field of processors and to methods of transferring data between memory and the processor. More particularly, the present application is directed to a method of accessing an individual value, or contiguous or non-contiguous group of values within a compressed data-structure in memory without the need for retrieving and decompressing the entire compressed structure.

BACKGROUND

There is a fundamental problem in the design of computing systems, namely that of minimizing the time cost of memory accesses.

This is a fundamental limitation on the design of computer systems as no matter what memory technology is used to support computation and no matter what technology is used to connect that memory to the processor, there is a maximum limitation on how much information can be transferred between processor and memory in a given time, this is the available memory bandwidth and the limitation of computer power by available memory bandwidth is often referred to as the "memory-wall".

The present application seeks to increase the effective memory bandwidth and thus minimize the limitation of the "memory-wall" through the use of data compression.

It is known to employ data compression to reduce the effects of the "memory wall". However, a problem for programmers using compressed memory sub-systems is that data has to be decompressed before it can be operated upon as shown in the system of FIG. 1. This usually involves reading the compressed data from one part of memory 10 into the register files of the processor 16, decompressing it using program code retrieved from program memory 18 and storing the decompressed data in another uncompressed portion of memory 12.

However this solution has the disadvantage that additional memory bandwidth is required to read compressed data, store it in uncompressed form, and read it back into the processor to be operated upon. Additional memory capacity is also required to hold the uncompressed data and the decompression process will increase pressure on the processors register-files. Clearly this is a sub-optimal solution which it is suggested explains why such compressed memory sub-systems have remained an academic curiosity rather than entering the mainstream microprocessor industry.

EP-0240032-A2 discloses a vector processor comprises a memory for storing and retrieving vector data. The vector processor comprises a plurality of vector registers each capable of reading or writing plural (m) vector elements in parallel, at least one mask vector register capable of m mask bits in parallel, transfer portion connected to the memory, the plurality of vector registers and the mask vector register and responsive to an instruction for transferring vector elements from regularly spaced address locations within the memory to selected storage locations of a selected vector register corresponding to valid mask bits. Whilst this approach is useful, it is limited in that the storage/retrieval of vector data is limited to an entire register.

Register-blocking is a useful technique for accelerating matrix algebra (particularly Finite-Element), however it has the disadvantage in that for many matrices (ex. As used in search engines such as GOOGLE®) zero fill has to be added decreasing effective FLOPS (Floating Point Operations Per Second), and increasing memory bandwidth requirements, both of which are commodities which are in short supply in modern computing systems. In fact the growing gap between processing capabilities and memory bandwidth which are increasing at highly disparate rates of 50% and 7% per annum respectively is referred to, as mentioned above, as the "Memory Wall". There have been many claims of "breaking" the memory wall and they usually consist of using a cache to reduce the probability of having to go off-chip, and/or using multi-threading so that the latency and penalties associated with going off-chip can be mitigated.

These approaches merely hide the problem of limited external memory bandwidth rather than solving it and generally rely on the data-set exhibiting sufficient data locality, and/or the program exhibiting sufficient Thread-Level Parallelism (TLP) in order to be effective at all, and this may not be true of all problems, and is certainly not always known a priori. In fact many of the larger and more interesting problems exhibit neither sufficient data-locality, nor sufficient TLP and the throughput of the whole system degenerates to the point where it is limited by external memory bandwidth, and the extra hardware which has been added on-chip is of no use. For this reason it is not uncommon to see large engineering applications pulling down processor performance to 1% or less of the manufacturers quoted peak performance specification.

SUMMARY

The present application seeks to increase the effective memory bandwidth and minimize the limitation of the "memory-wall" on computation by storing data in a compressed format. This is achieved by providing a means of compression and decompression which is suitable for block-structured data used in many applications including, for example, computer graphics, rigid-body dynamics, finite-element analysis and other scientific and engineering applications, which operate on large data sets which must be stored in memory. In order to further reduce the effect of the "memory-wall", the processor pipeline is also modified in such a way as to take advantage of compression, increasing the processing rate beyond what can be achieved by operating on compressed data alone.

More particularly, the present application allows random-access to individual values within a compressed structure stored in memory through the use of a value map and associated field bits specified as part of an instruction.

Accordingly, a first embodiment of the application provides a processor as detailed in claims 1 and 38. The application also provides a method as detailed in claims 21 and 56. The application further provides a data processing machine as detailed in claims 35 and 69. Advantageous embodiments are provided in the dependent claims.

BRIEF DESCRIPTION OF THE DRAWINGS

The present application will now be described with reference to the accompanying drawings in which:

FIG. 2 is a series of transformations for which the processor of the present application is suitable for processing.

FIG. 4 illustrates a exemplary compression method that may be employed by the processor of FIG. 3, FIG. 11 is an illustration of address sequence generation for use in FIG. 10.

FIG. 14 is an instruction format,

FIG. 15 is a table showing various opcode instructions available in an exemplary processor including instructions for loading/storing compressed data, FIG. 18 illustrates the computational savings that may provided by the exemplary processor of FIG. 3 for different types of matrix structure.

DETAILED DESCRIPTION

Figure 1:
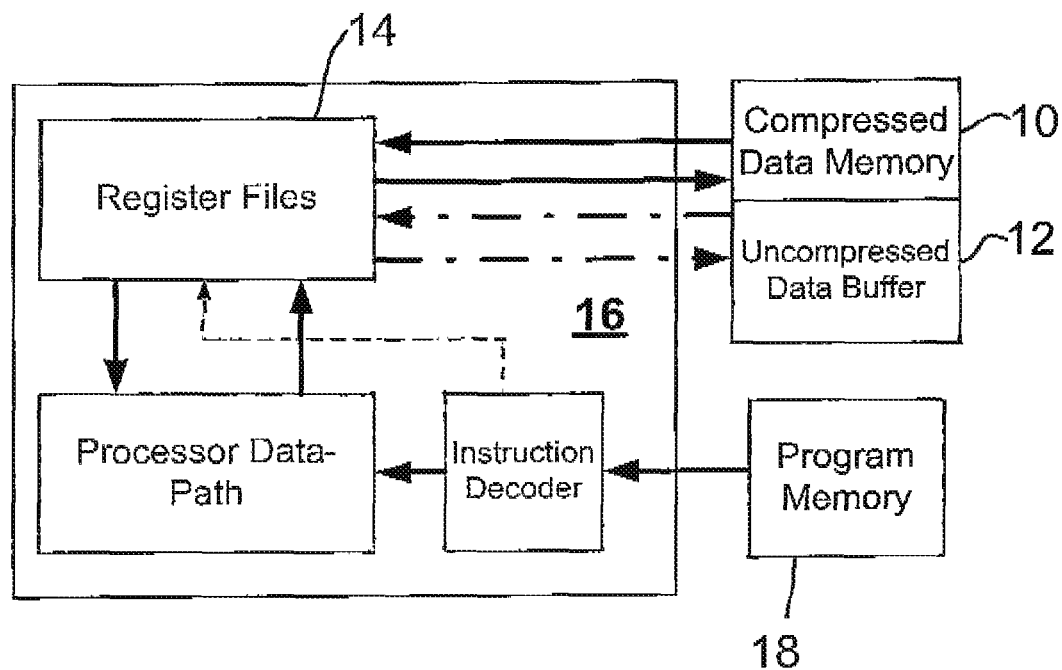
FIG. 1 is a processor arrangement known in the art.
Figure 3:
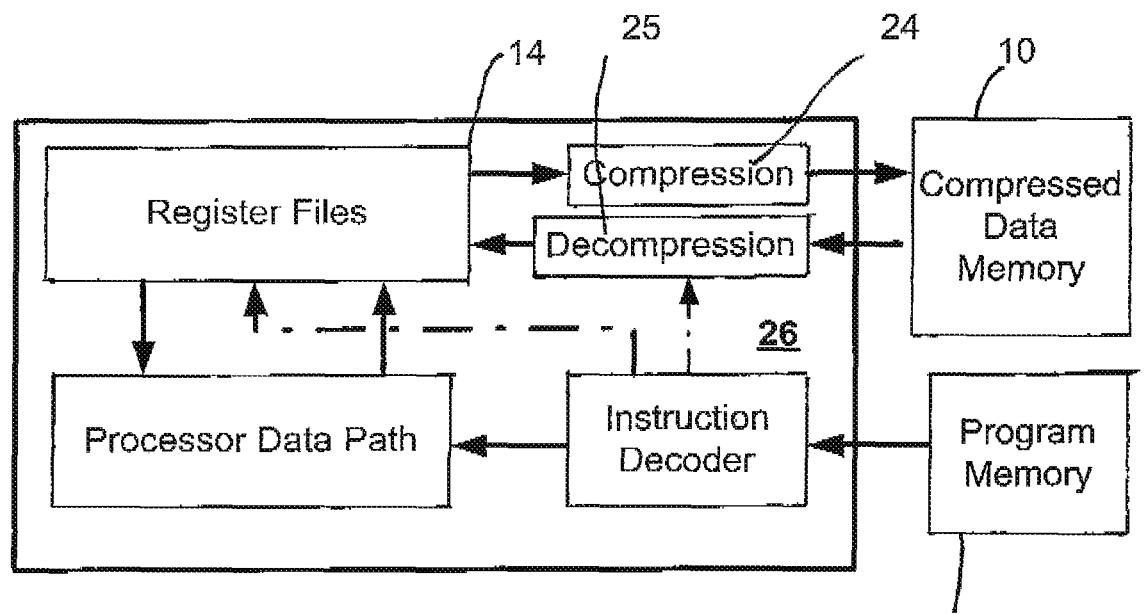
FIG. 3 is an exemplary processor according to an embodiment of this application.

The present application, shown in FIG. 3, provides a modified processor which is capable of operating directly upon compressed data in memory without the requirement for decompression processing, thus eliminating the requirement for an additional uncompressed data buffer and additional processor and memory bandwidth required to handle decompression of compressed data into a buffer area for further processing. Instead, the compression and decompression processes are integrated in the memory access structures of the processor.

A typical example of the desirability of compression is the use of matrix representations and linear algebra operators to simulate reality on a 2-dimensional screen in computer graphics and related applications. Operations on a source data matrix often of rotations and other transformations, and often sequences of them, of the type shown in FIG. 2. As can be seen these matrices contain a large number of zeroes which require a large amount of memory bandwidth to load/store while not contributing to the result of the calculations performed using the whole matrix, i.e. they are trivial values from the point of view of arithmetic.

The present application, shown in FIG. 3, provides a modified processor which is capable of operating directly upon compressed data in memory without the requirement for decompression processing, thus eliminating the requirement for an additional uncompressed data buffer and additional processor and memory bandwidth required to handle decompression of compressed data into a buffer area for further processing. Instead, the compression and decompression processes are integrated in the memory access structures of the processor.

The application allows compressed structures of arbitrary size and complexity, consisting, for example but not limited to, any combination of the following: floating-point matrices, floating-point vectors, floating-point scalars, signed integers, unsigned integers, packed characters and address-pointers.

Suitably, the compression and decompression logic is embedded within the processor load/store ports, making the programmer's job easier in terms of not having to worry about the details of how data is read/written from/to the compressed memory subsystem on a transaction by transaction basis.

The solution described herein employs a value map to code for zero and nonzero entries in dense sub-matrix in the manner shown in FIG. 4. The use of such a value map has been described previously in related applications (U.S. Ser. No. 60/911,273 filed 11 Apr. 2007, U.S. Ser. No. 60/911,274 filed 11 Apr. 2007 and UK 0704999.2 and UK 0704976.0 and corresponding PCT applications claiming priority therefrom) the entire contents of which are incorporated herein by reference. In the example shown a compression of 37.5% is achieved. The proposed solution has the advantage that each zero entry in the matrix to be stored is represented by a 1-bit rather than a 32-bit single-precision, 64-bit double-precision, etc. number. Overall compression is achieved as long as 1 or more entries per dense-matrix are zero in a 32-bit memory system storing a sparse matrix with 32-bit single-precision entries.

While the basic compression method outlined above is interesting and offers advantages, in most practical applications the programmer desires to store more than just sparse matrices and often needs to store and retrieve data stored in complex data-structures. The challenge is how to integrate a compression scheme so that it can provide similar performance and memory compression benefits to those outlined previously when handling mixed compressed/uncompressed data structures without overly burdening the programmer.

The present application provides a means of random accessing data within a larger structure which may be compressed in the manner described previously, but may also contain uncompressed floating-point or integer data. The scheme allows a basic structure containing up to thirty-two 32-bit entries to be represented by a 32-bit integer (value map). In principle, the scheme is not limited to 32 but values or structures with 32 entries and the size of the value map and the number of entries may be selected to meet the requirements of the processor design. The presence of a 1-bit in the value map indicates the presence of a non-trivial floating-point or integer value at that position in memory as before. As each value is represented by a single bit, the value map may be referred to also as a bit map. An example of how a mixed (compressed/uncompressed) structure would be stored in memory is shown in FIG. 5.

The basic principle of operation of the proposed compressed structure decompression logic is that a value map is used to represent the presence of trivial values. For the purposes of this application a trivial value is a 0.0 single precision (32-bit) floating-point value (Hex 00000000), however the same scheme may easily be extended to double-precision floating-point or beyond. Alternately if there were a preponderance of some other value than 0.0 in a particular data-set the scheme outlined here could easily be extended to allow a value map 0 represent that value rather than 0.0, for instance some data sets might contain many 1.0 values.

Figure 5:
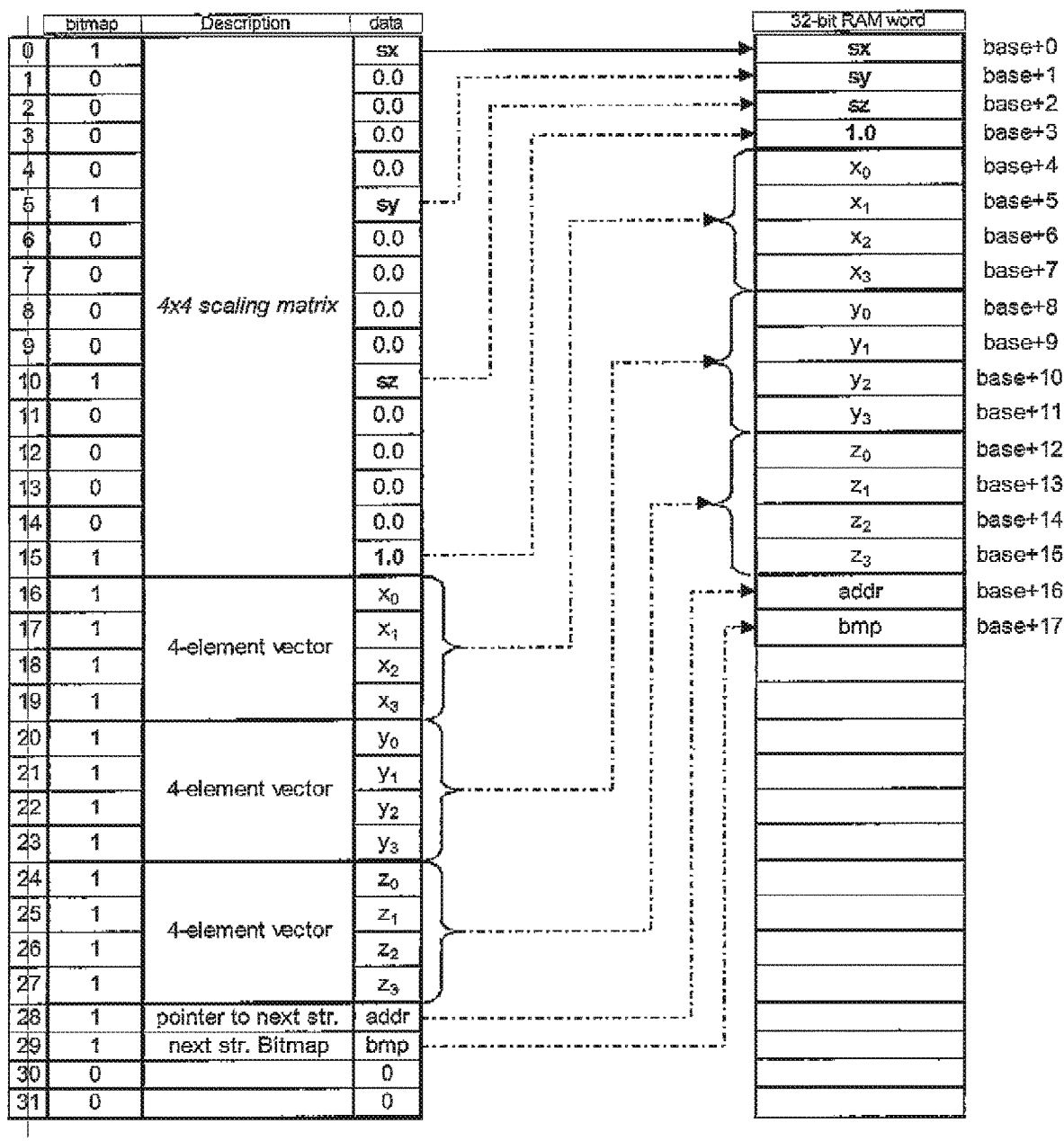
FIG. 5 illustrates how a memory structure can be compressed to fit in 32 bit RAM by the processor of FIG. 3.

As can be seen from the RAM addresses, for an exemplary arrangement of data, in FIG. 5 it can be seen that for each non-zero entry (sx, sy, sz, x0-X3, y0-y3, z0-z3) in the 32-bit value map an offset of 1 is added to the base address. In practice both the value map and the base address of the next structure in memory may be embedded in the current structure and retrieved by the programmer.

To make use of compressed structures it is beneficial to reduce the overhead for the programmer in storing and retrieving the data stored in compressed form. In the present application, the programming overhead is minimised by hiding the complication of storing and retrieving compressed data inside the Load-Store Unit (LSU) address-generators of the processor which may for example be a RISC processor. The address generators allow a programmer to specify which elements of data are to be retrieved from a compressed structure. In turn, the LSU is able to retrieve the requested elements from the compressed structure in memory without decompressing the entire compressed structure.

Figure 6:
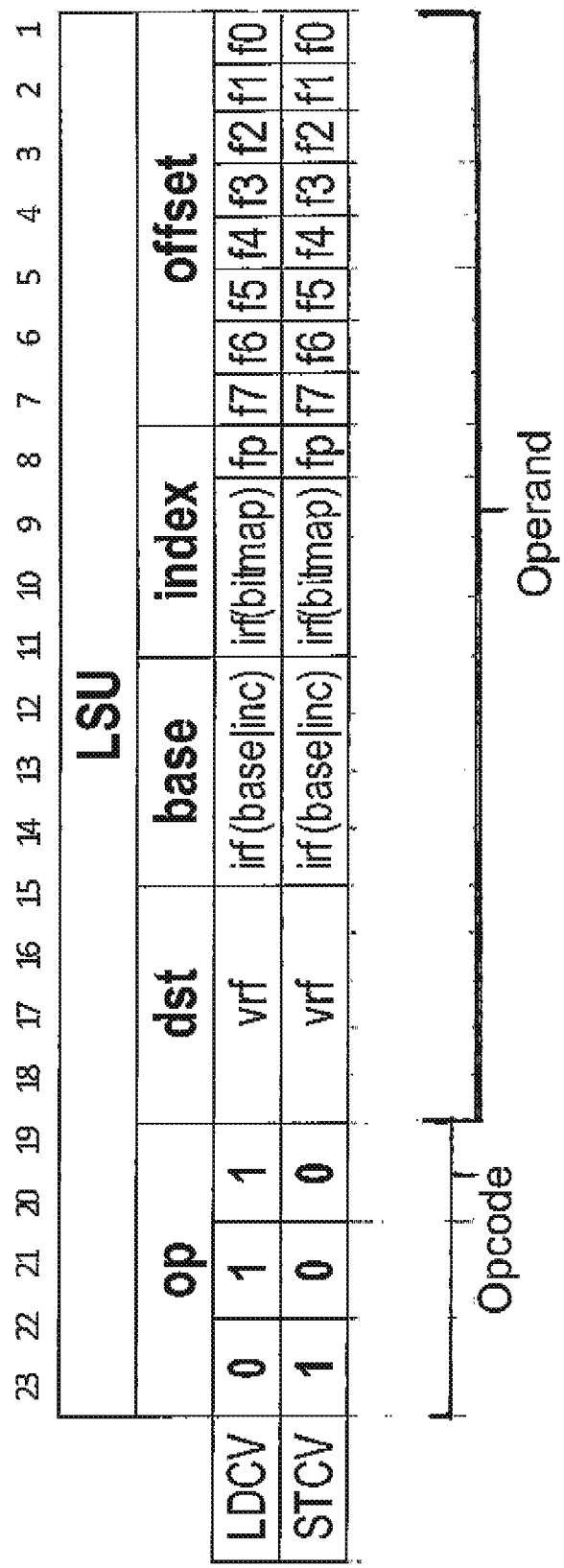
FIG. 6 illustrates the format of exemplary instruction codes that may be employed by the processor of FIG. 3.

Thus in the exemplary arrangement described herein, the address generators allow the programmer to specify which of 8 possible 4-entry fields (vectors) from a 32-entry compressed structure are to be loaded/stored using a simple 8-bit field mask which is included in the load/store opcode as shown in FIG. 6. In the exemplary arrangement described herein, the instruction for loading a compressed vector is LDCV, whereas the instruction for storing a compressed vector is STCV.

This exemplary arrangement allows a programmer to specify the 4-entry vector register file (VRF) register to which data will be loaded/stored from/to. The base register in the integer register file (IRF) to which the addressgenerator will add the compressed-structure offset and the value map register also in the IRF. The opcode then contains an immediate 8-bit value f[7:0] which is used to select which of the eight four-entry compressed vectors actually get loaded/stored from/to the VRF.

Figure 7:
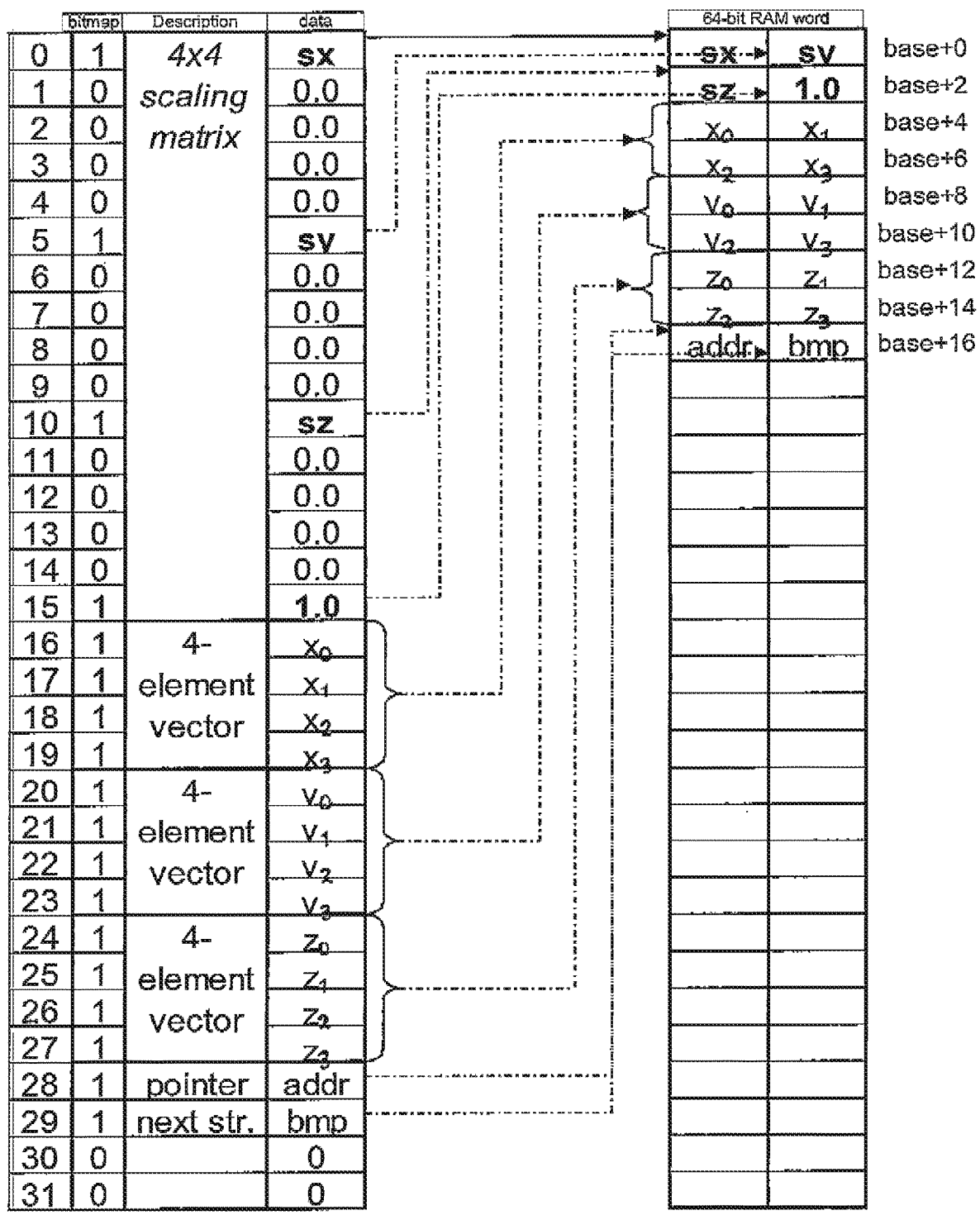
FIG. 7 illustrates how the same memory structure of FIG. 5 can be compressed to fit in 64 bit RAM by the processor of FIG. 3.

As the LSU port-width is generally limited, in the case of exemplary arrangement in this application to 64-bits, it will be appreciated that the LDCV and STCV instructions necessarily take multiple clock-cycles. As a result the value map is decoded in an iterative fashion in the order of the f-bits causing a 64-bit compressed entry to be written to or read from the correct VRF register and stored to or read from the correct memory (RAM) address as seen from the LSU port. The layout in RAM of a typical compressed structure in a 64-bit memory subsystem is as shown in FIG. 7.

It will be appreciated that the method and arrangement is not limited to 32 bit words or 64 bit wide memories and that similar layouts are possible for other memory widths including 96 and 128-bit wide memories etc, however for simplicity of explanation such arrangements organizations will not be discussed in detail here.

The VRF may be used as a staging area for the complete compressed structure before parts of it are dispersed to other register files internal to the processor in the case of a compressed load, or alternately for the storing of a compressed structure to external RAM attached to the LSU port.

Figure 8:
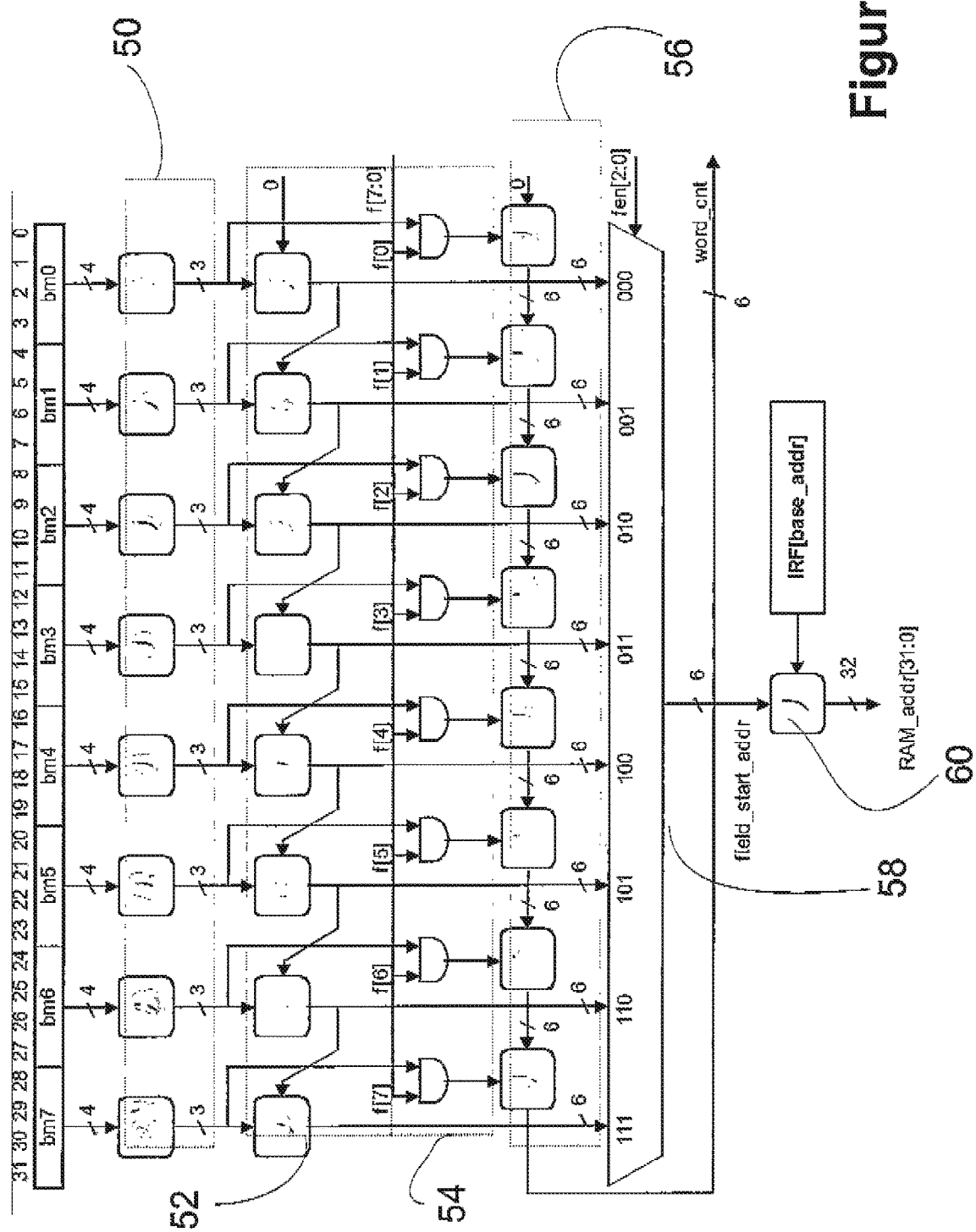
FIG. 8 is an exemplary circuit for generating addresses which might be employed by the processor of FIG. 3, FIG. 9 demonstrates the operation of FIG. 8 with exemplary values, FIG. 10 demonstrates exemplary load/store circuit that might be employed in the processor of FIG. 3.

An exemplary logic for the LSU will now be discussed with reference to FIG. 8, which shows the logic for the LSU compressed-structure address generator for loading values from within a compressed structure at a given base address (base_addr). A first row of adders 50 (compressors) is provided to compress the value map structure of 32 bits arranged in eight 4-bit value map fields (bm7-bm0) into eight 3-bit numbers, each of which represents the number of ones in a given 4-bit value map. A second row of adders 52 is provided to add the results of the row of compressors to generate the start address of each value map so that each value map field may be addressed independently if required by applying the appropriate f-bits in the compressed load or store opcode. A row of AND gates 54 is provided to mask out unrequired fields depending on the state of the f (field) bits set in the compressed load/store opcode. The outputs of these AND gates are then summed by a further set of adders 56 to generate the total number of 32-bit words (word_cnt) which must be loaded/stored from/to memory based on the opcode f-bits. A final 8:1 multiplexer stage 58 is controlled by an 8 field-enable which allows the required value map addresses selected to be applied sequentially to a final adder 60 in order to generate the required RAM addresses.

Figure 9:
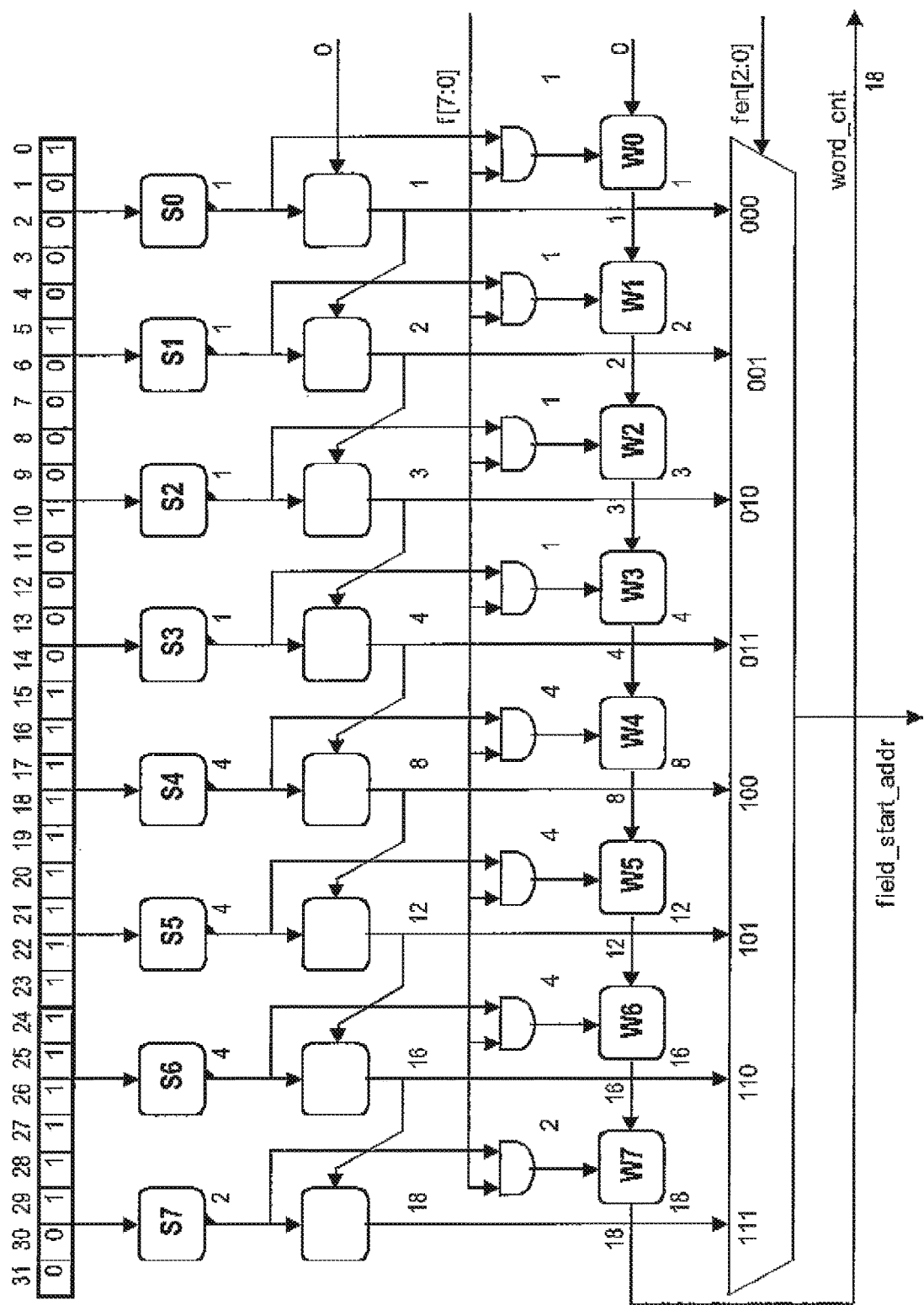

The values of the various signals for the example compressed data structure are shown in FIG. 9. The addresses shown are calculated statically from the value map in the selected IRF (Integer Register File) register and are then applied sequentially depending on the stage of the f-bits specified in the compressed load or store instructions.

Figure 10:
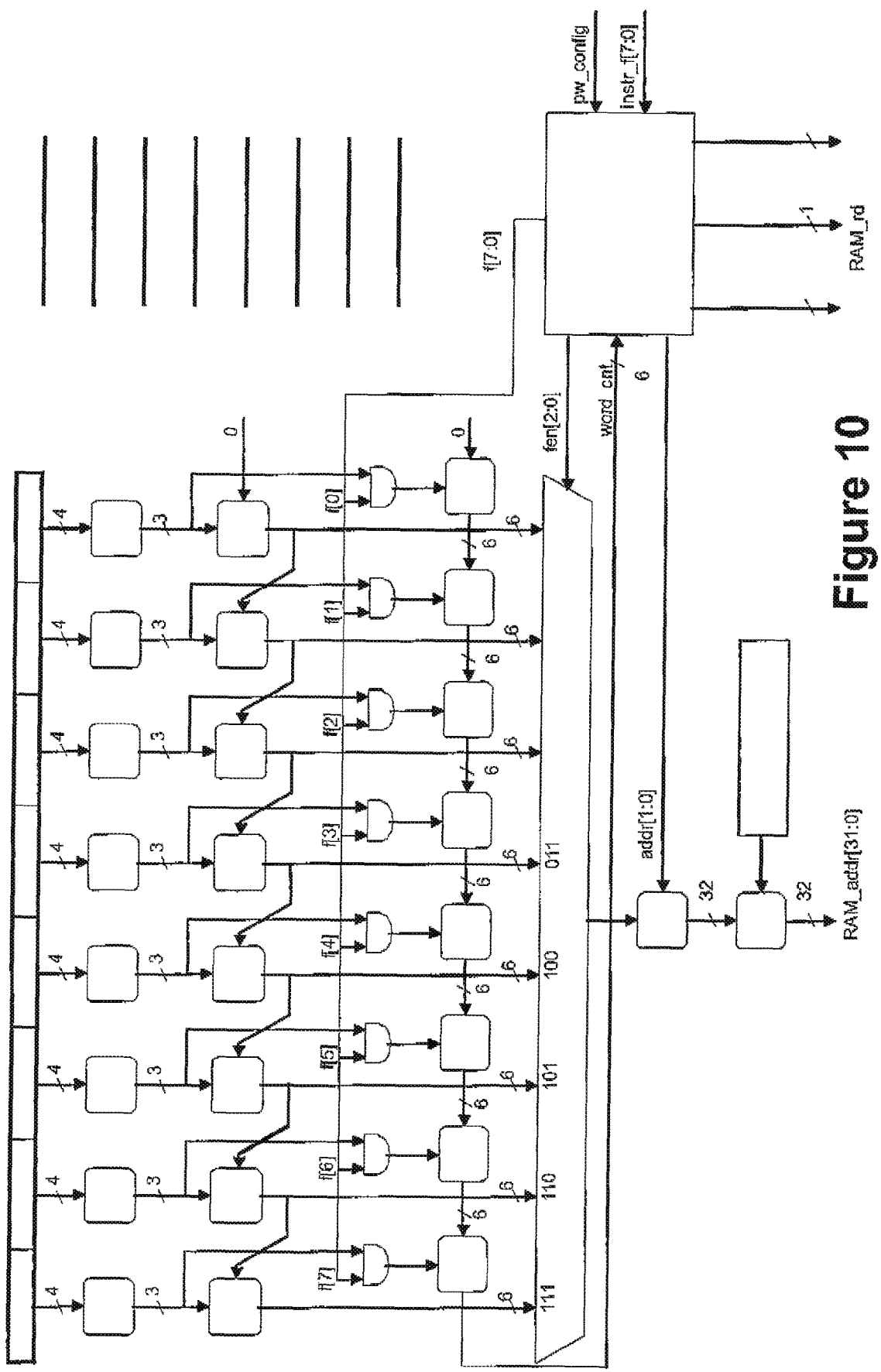

The complete address-generation logic for the compressed load/store operations including the counter and finite-state machine to generate the required control signals is shown in FIG. 10.

The fen[2:0] signal which selects the sequence of addresses to be applied to the address selection multiplexer operates according to the truth-table shown in FIG. 11. As may be seen in FIG. 12 not only are the source/destination addresses required for the compressed load/store operations generated by the LSU address-generator, but the source/destination addresses for the source/destination VRF rows relative to that specified in the compressed load/store operation are also generated. In the case of a 64-bit LSU bus up to 2 VRF rows may be addressed in a compressed load/store instruction. Although in the present exemplary arrangement, the VRF was chosen as the source/destination for data loaded or stored in compressed load/store operations, in principle the Integer Register File (IRF) or scalar register file (SRF) could equally have been chosen.

Figure 12:
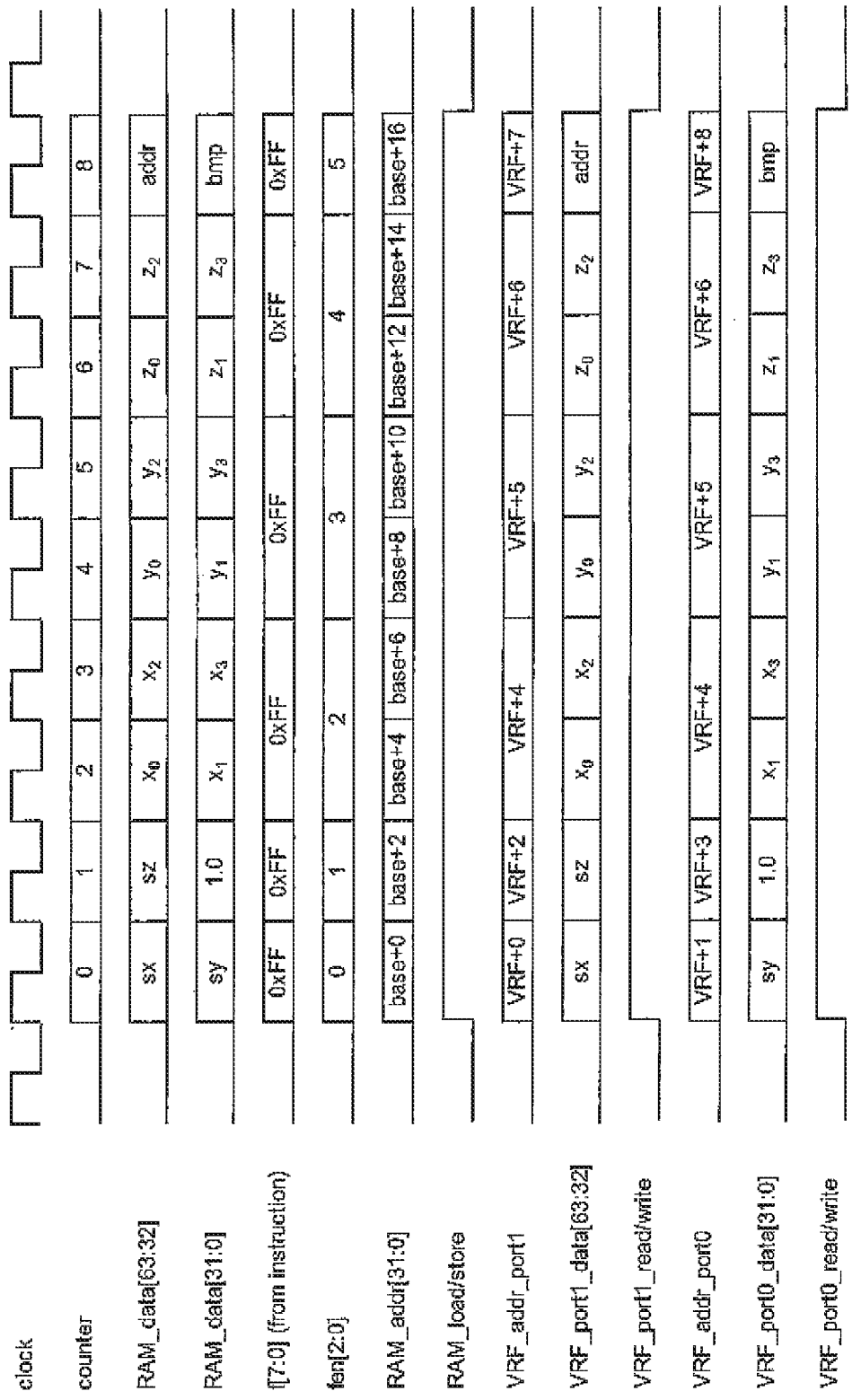
FIG. 12 is an exemplary timing diagram illustrating the mode of operation of the circuit of FIG. 10.

The exemplary timing diagram of FIG. 12 shows clearly that the compressed load/store operation takes multiple cycles to execute and all of the required control signals are generated from knowledge of the IRF value map descriptor for the compressed structure coupled with the f-bits specified in the compressed load/store control word. The sequence of control signals is derived using the f-bits and value map in conjunction with a counter which is driven by the clock input to the address-generator.

The diagram shows behavior for both the load and store operations, the only difference between the 2 operations would be:
1. In the case of a compressed load a read signal is generated to read from the RAM attached to the LSU port and a write signal is generated for the appropriate VRF row which acts as a destination for the RAM contents. In fact a series of RAM reads and VRF writes may be generated depending on the state of the value map in the IRF and the f-bits set in the compressed load opcode.
2. Similarly in the case of a compressed store a series of VRF reads and RAM writes may be generated depending on the state of the IRF value map and the f-bits set in the compressed store opcode.

Figure 13:
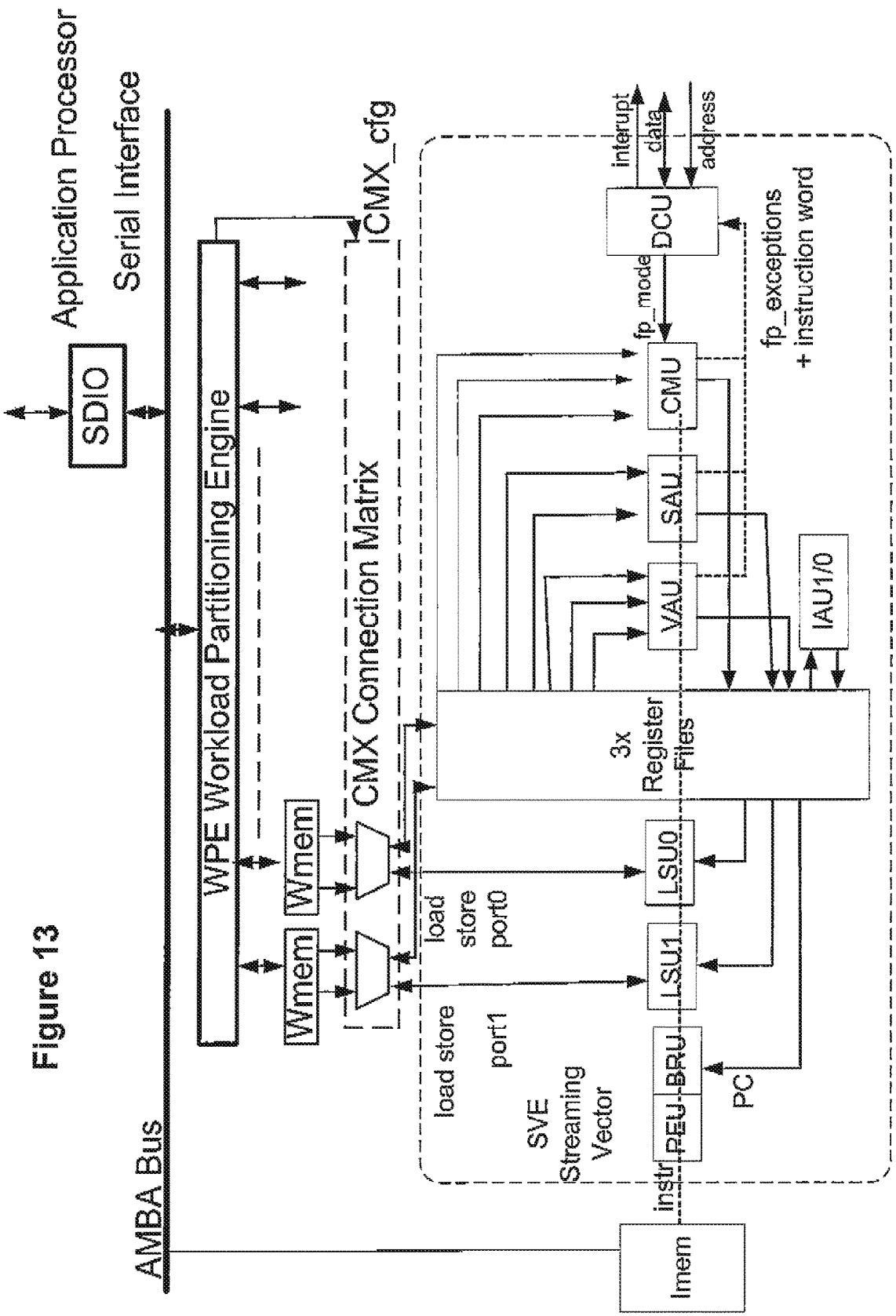
FIG. 13 is a more detailed block diagram of the processor of FIG. 3.

A block-diagram of the SVU architecture, of which the Load Store Unit (LSU) with compressed load/store operations forms a part, is shown in FIG. 13. As can be seen the principal external interfaces are to the SVU instruction memory, and the LSU ports which connect to the data memory-banks as well as the debug control unit (DCU) which allows SVU registers and diagnostic information to be read/written via the processor bus.

The instruction word has 7 slots which allow it to control up to 7 of the 9 functional units per cycle as shown in FIG. 14.

In the present exemplary embodiment, the leftmost bit of the 128-bit instructions is reserved to provide for future features and the remaining 127 bits are split into fields, each of which controls one of up to 9 functional units contained in the preferred embodiment of processor architecture:
1×Predicated Execution unit (PEU)
1×Branch/Repeat Unit (BRU)
2×Load-Store Units (LSU)
1×Vector Arithmetic Unit (VAU)
1×Scalar Arithmetic Unit (SAU)
2×Integer Arithmetic Units (IAU)
1×Compare/Move Unit (CMU)

A final functional unit not under the direct control of the instruction-word is the Debug Control-Unit (DCU) which allows the processor to monitor and control program execution, especially in the event that exceptional conditions and/or interrupts occur.

The exemplary LSU allows vector data to be loaded from memory into VRF registers by the programmer. The LSU is controlled by a 24-bit opcode and can perform one of 8 operations:
NOP i.e. not load any data from memory (clocks gated off for power-saving)
LDVX load 4-element uncompressed vector from memory
STVX store 4-element uncompressed vector to memory
LDCV load 4-element compressed vector from memory
STCV store 4-element compressed vector to memory
LOLI load 16-bit immediate into lower 16-bits of specified IRF register
LDHI load 16-bit immediate into upper 16-bits of specified IRF register
CPXI copy size/address of field 1-8 in IRF value map to IRF base register An exemplary opcode table for the LSU is shown in FIG. 15.

Figure 16:
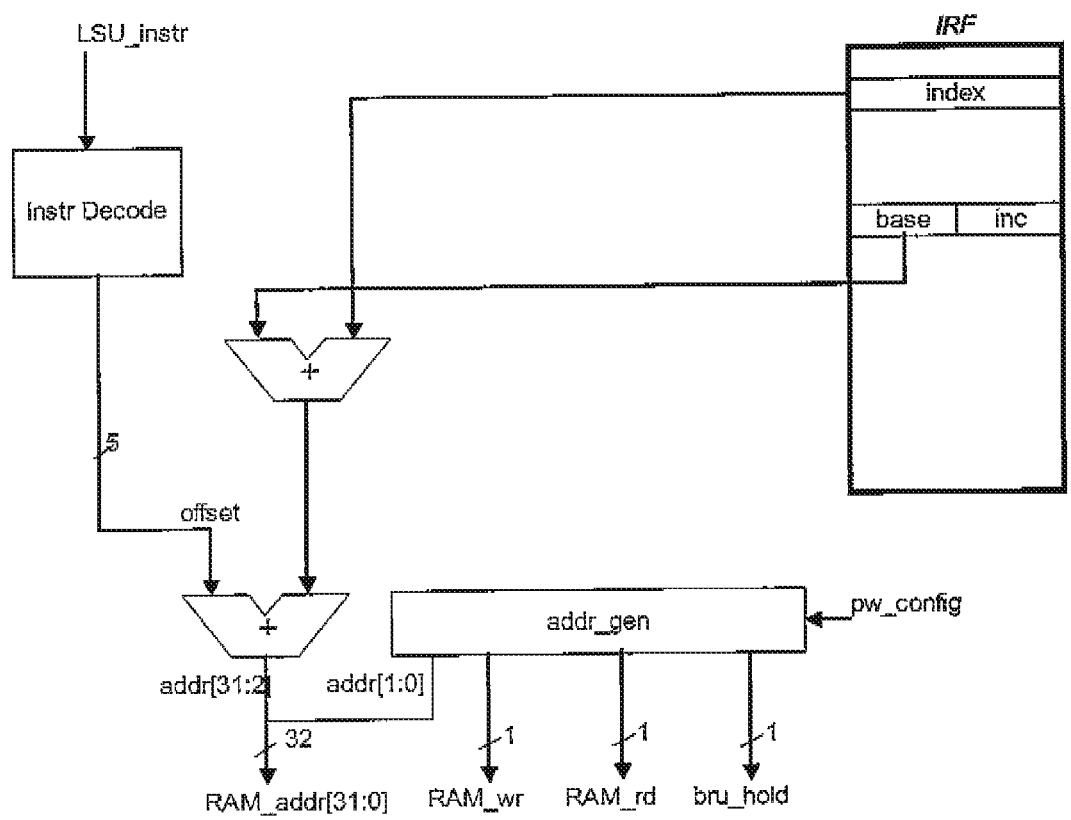
FIG. 16 is a circuit for address generation for a non compression based instruction.

A block diagram of the LSU in uncompressed load/store mode is shown in FIG. 16. In this mode, the bru_hold signal prevents the program-counter (PC) in the BRU from advancing until the load/store operation has been completed. This is important where loads and stores do not complete in a single cycle because the 4 vector elements must be transferred in 1 s or 2 s rather than 4 elements in a single cycle (128-bits).

Figure 17:
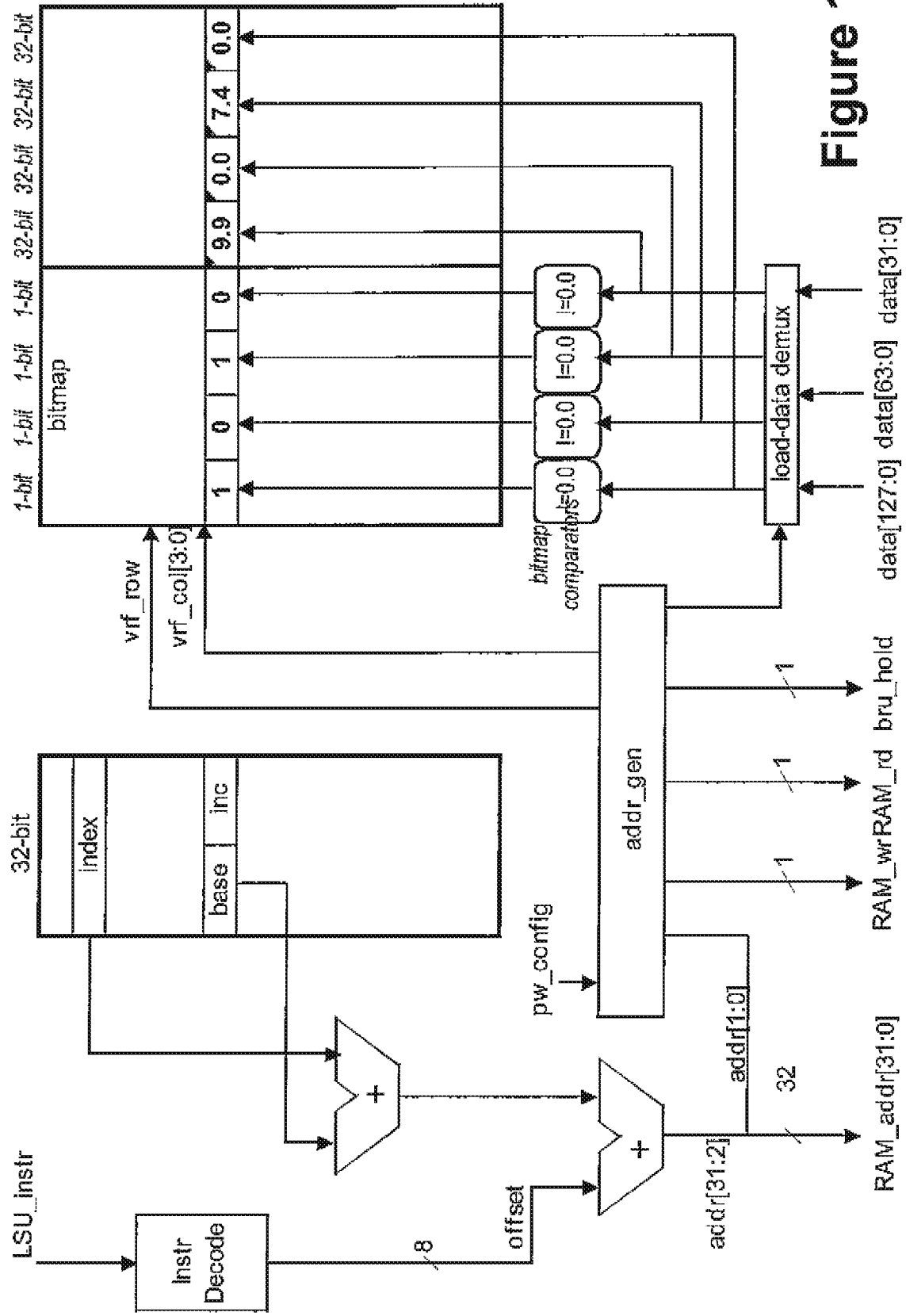
FIG. 17 is circuit for generating a bit as employed by the compression method of the processor.

The block-diagram of the value map generation logic and load/store path to the VRF is shown in FIG. 17 for Non-Zero Value map Generation. Whenever an uncompressed 4-element vector is loaded from memory into the VRF an additional 4-entry non-zero value map is generated using a row of 4 comparators (4×32-input NOR gates) and inserted on the corresponding VRF row as the data fetched from memory. This 4-bit value map entry may be used later to store data back to memory in compressed format and to minimise power dissipation by eliminating trivial operations on zero values.

A unique capability of the processor architecture described herein is its support for the loading and storing of compressed data in a random access manner without requiring the entire compressed structure to be retrieved. The reason for this support is that many interesting applications operate on large bodies of sparse data i.e. the data contains large numbers of zeroes which have to be fetched from memory and when operated upon generate zero results.

The main assumptions in the architecture are that all data to be handled by the processor is packed into 4-element vectors to be stored in memory, whether this data is compressed or uncompressed, and whether the data consists of matrices, vectors and packed scalars or integers. Based on this assumption the programmer may organise matrix/vector/scalar/integer data into 32-entry compressed blocks where only those entries which are non-zero are explicitly stored. All zero values and non-zero values are represented by a 1-bit entry in a non-zero value map which can then be used to compress/uncompress the 32-entries into 32 or fewer, 32-bit words in RAM.

The transformation matrices used in 30 graphics and game physics (rigid body dynamics) applications shown in Figure are a good example. The 32-bit value maps corresponding to the 8 matrices are shown in detail in FIG. 2.

As can be seen in FIG. 18 graphics transformation matrices contain a large percentage of trivial (zero values) allowing over 50% data-compression to be achieved.

Figure 19:
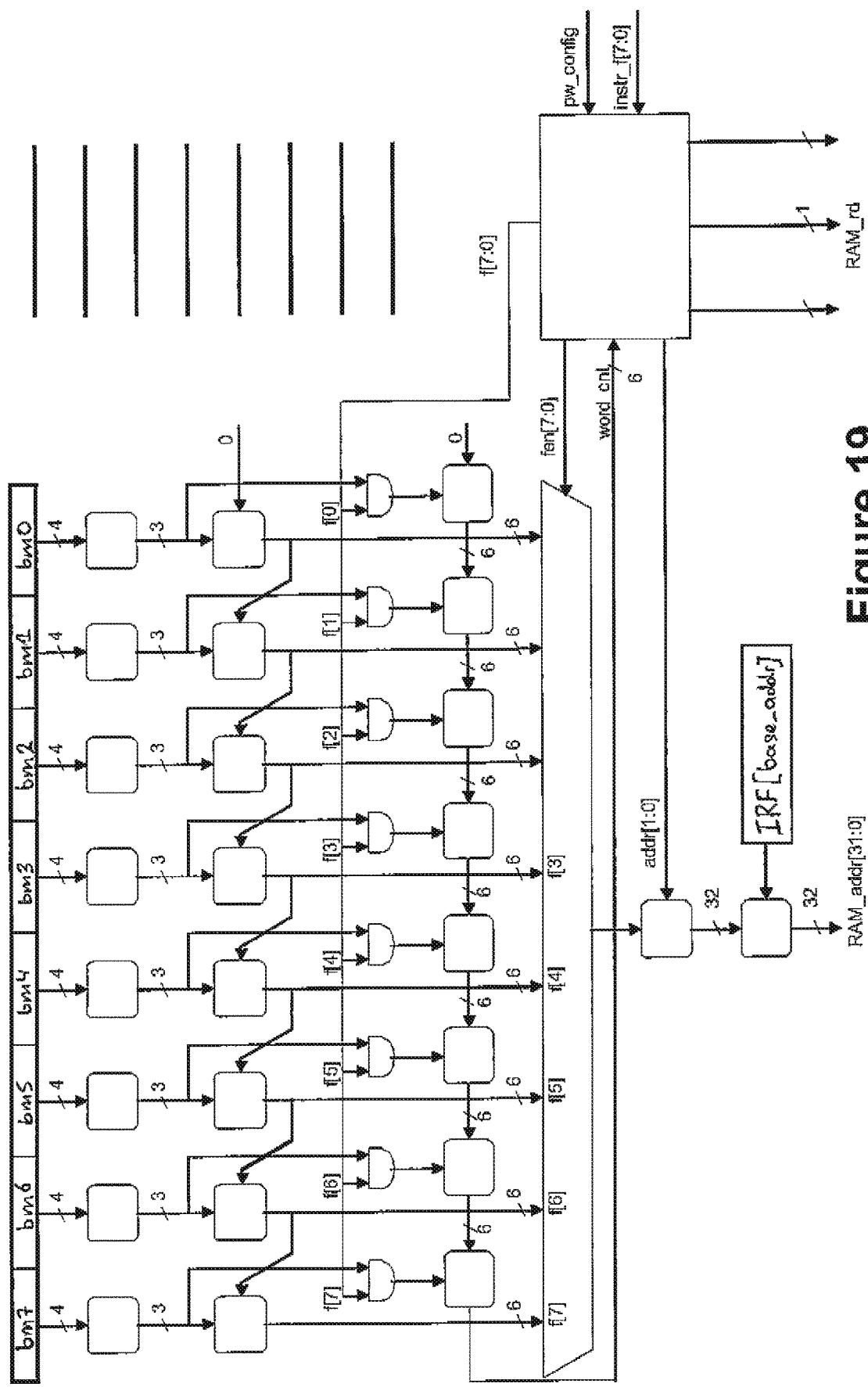
FIG. 19 is a circuit suitable for the processor of FIG. 2 for loading/storing compressed data.

The compression value maps are used to allow random-access into programmer defined complex data-structures using the hardware shown in FIG. 19. The compressed load operation allows the programmer to gather a series of up to 8×4-element values specified by an 8-bit field in the opcode from addresses beginning at the base address specified in the IRF. The hardware automatically generates the required addresses and read signals as well as generating a hold signal to hold the BRU in the case of multi-cycle loads being required, for example if more than 4 non-zeros must be loaded from memory. In contrast, in the prior art this type of complex scatter gather functionality is typically complex to achieve with traditional processor architectures requiring multiple registers to be set up with base addresses and offsets to allow the indexing of complex data-structures. Furthermore such traditional processor architectures make no provision for the compression of trivial data-values.

Figure 20:
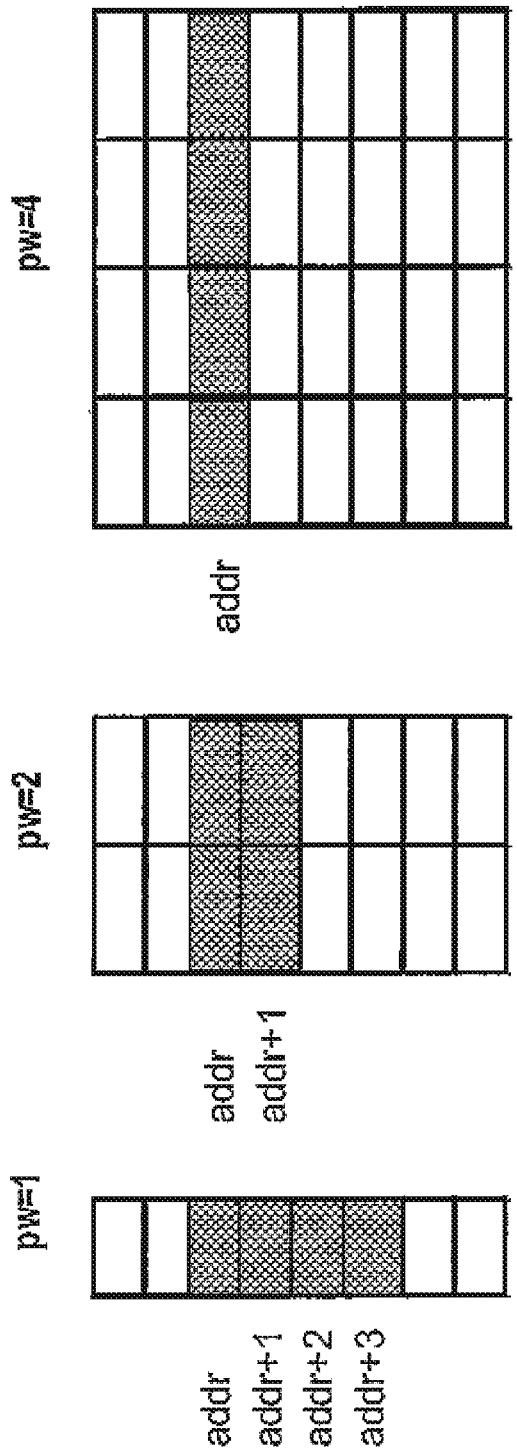
FIG. 20 illustrates the effects of port width on memory organization.

Suitably, the LSU port widths are configurable independently via the SVU_LCR register detailed in section 6. The port width parameter allows top level Soc interconnect to be traded off against the throughput of the SVU by allowing 4-element vectors to be loaded/stored in multiple transactions over a 1/2/4 element wide data bus attached to the SVU LSU ports as shown in FIG. 20.

Figure 21:
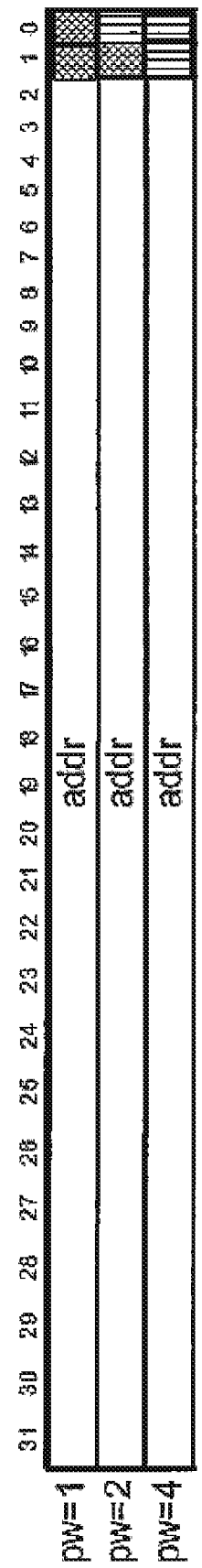
FIG. 21 illustrates the resulting effect on address generation for the addresses shown in FIG. 20.

The generation of the additional address lsbs to support the port-width parameterisation is performed using a counter which appends 0, 1 or 2 address lsbs to the address generated by the LSU as shown in FIG. 21.

Figure 22:
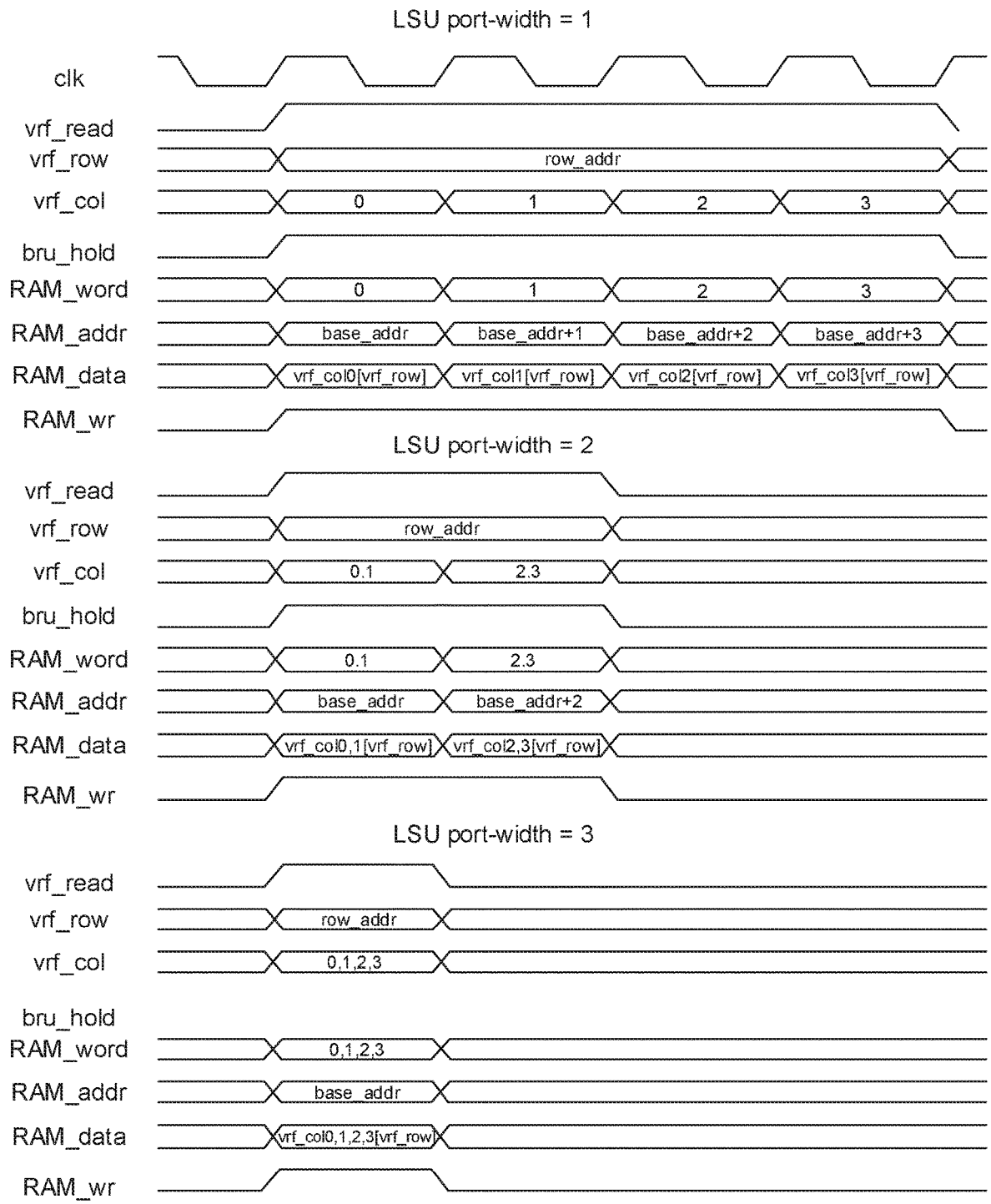
FIG. 22 is exemplary timing diagrams illustrating the effects of FIG. 20.

The effect of the port-width parameter on a 4-element store to SVU RAM is shown in FIG. 22. As can be seen in FIG. 18 graphics transformation matrices contain a large percentage of trivial (zero values) allowing over 50% data-compression to be achieved.

The compression value maps are used to allow random-access into programmer defined complex data-structures using the hardware shown in FIG. 19. The compressed load operation allows the programmer to gather a series of up to 8×4-element values specified by an 8-bit field in the opcode from addresses beginning at the base address specified in the IRF. The hardware automatically generates the required addresses and read signals as well as generating a hold signal to hold the BRU in the case of multi-cycle loads being required, for example if more than 4 non-zeros must be loaded from memory. In contrast, in the prior art this type of complex scatter gather functionality is typically complex to achieve with traditional processor architectures requiring multiple registers to be set up with base addresses and offsets to allow the indexing of complex data-structures. Furthermore such traditional processor architectures make no provision for the compression of trivial data-values.

Suitably, the LSU port widths are configurable independently, for example, by means of a parameter provided as an entry in a register. The port width parameter allows top-level Soc interconnect to be traded off against the throughput of the SVU by allowing 4-element vectors to be loaded/stored in multiple transactions over a 1/2/4 element wide data bus attached to the SVU LSU ports as shown in FIG. 20.

The generation of the additional address lsbs to support the port-width parameterisation is performed using a counter which appends 0, 1 or 2 address lsbs to the address generated by the LSU as shown in FIG. 21.

The effect of the port-width parameter on a 4-element store to SVU RAM is shown in FIG. 22. As can be seen the number of cycles taken to load or store a 128-bit vector takes 4 cycles when port width is 1 (32-bits), 2 cycles when the port width is 2 (64-bits) and 1 cycle when the port width is 4 (128-bits).

Although the present application has been described with respect to a processor with an instruction set having an identified opcode for performing the data transfer between the memory and the processor, it will be appreciated that the function may be performed where there is no explicit instruction-set in program storage, but rather loads and stores are performed under the control of a state-machine or other means. A significant advantage is that one or more items of data may be retrieved from a compressed structure in memory without having to retrieve or decompress the entire compressed structure. Similarly, a single item of data may be updated in a compressed structure stored in memory without having to retrieve or decompress the entire compressed structure.

The words comprises/comprising when used in this specification are to specify the presence of stated features, integers, steps or components but does not preclude the presence or addition of one or more other features, integers, steps, components or groups thereof.

What is claimed is:

1. An apparatus to access an individual data value in a compressed data structure, the apparatus comprising:
    a load-store unit (LSU) to:
        generate a binary sequence corresponding to zero entries and non-zero entries of an uncompressed data structure; and
        generate a value map from the binary sequence, the value map appended to the compressed data structure and including binary placeholders for the binary sequence, each respective binary placeholder including a respective value of zero or one corresponding to a respective zero entry or non-zero entry of the uncompressed data structure;
    a first adder to arrange the value map in individually selectable fields, the individually selectable fields corresponding to individual data values from the compressed data structure, the value map including address offsets for the respective non-zero entries et the uncompressed data structure;
    a second adder to generate start address values for the individually selectable fields;
    an AND-gate to mask unrequired fields identified by respective binary placeholders associated with a requested one of the individual data values; and
    a third adder to associate the requested one of the individual data values with a corresponding one of the generated start address values to retrieve the requested one of the individual data values without decompressing remaining data values from the compressed data structure.

2. The apparatus as defined in claim 1, wherein the value map includes a base address value associated with the uncompressed data structure.

3. The apparatus as defined in claim 1, further including a multiplexer to sequentially apply address values of the value map to generate a random access memory (RAM) address for the requested one of the individual data values.

4. The apparatus as defined in claim 1, wherein the non zero entries correspond to memory positions having at least one of a non-zero integer value or a non-zero floating-point value.

5. The apparatus as defined in claim 1, wherein the value map includes address offsets only for associated non zero value memory positions.

6. The apparatus as defined in claim 1, further including an instruction set architecture having at least one of a load instruction or a save instruction invoked by opcode bits, the opcode bits corresponding to the binary placeholders.

7. The apparatus as defined in claim 6, wherein the opcode bits include memory position information associated with the individual data values of the uncompressed data structure.

8. The apparatus as defined in claim 1, wherein the AND gate is to generate the start address values for the requested one of the individual data values by:
    counting a number of non zero data values that precede the requested one of the individual data values; and
    adding the number as a base address offset to be used to select the requested one of the individual data values.

9. A processing device comprising at least;
    at least one storage device including executable instructions that, when executed, cause the processing device to:
    generate a binary sequence corresponding to zero entries and non-zero entries of an uncompressed data structure;
    generate a value map in individually selectable fields from the binary sequence, the value map appended to a compressed data structure and including binary placeholders for the binary sequence, each respective binary placeholder including a respective value of zero or one corresponding to a respective zero entry or non-zero entry of the uncompressed data structure;

arrange a value map in individually selectable fields, the individually selectable fields corresponding to individual data values from a compressed data structure, the value map including address offsets for the respective non-zero entries of the uncompressed data structure;

generate start address values for the individually selectable fields;

mask unrequired fields identified by respective binary placeholders associated with a requested one of the individual data values; and associate the requested one of the individual data values with a corresponding one of the start address values to retrieve the requested one of the individual data values from the compressed data structure without decompressing remaining data values in the compressed data structure.

10. The processing device as defined in claim 9, wherein the instructions, when executed, cause the processing device to identify a base address value in the value map, the base address value associated with the uncompressed data structure.

11. The processing device as defined in claim 9, wherein the instructions, when executed, cause the processing device to sequentially apply address values of the value map to generate a random access memory (RAM) address for the requested one of the individual data values.

12. The processing device as defined in claim 9, wherein the instructions, when executed, cause the processing device to identify the non zero memory positions as at least one of an integer value or a floating-point value.

13. The processing device as defined in claim 9, wherein the instructions, when executed, cause the processing device to identify the non zero value memory positions based on a bit representation of "1", and to identify the zero value memory positions based on a bit representation of "0".

14. The processing device as defined in claim 9, wherein the instructions, when executed, cause the processing device to identify the address offsets only for associated non zero value memory positions.

15. The processing device as defined in claim 9, wherein the instructions, when executed, cause the processing device to invoke an instruction set architecture having at least one of a load instruction or a save instruction associated with opcode bits.

16. The processing device as defined in claim 9, wherein the instructions, when executed, cause the processing device to:

count a number of non zero data values preceding the requested one of the individual data values; and add the number as a base address offset to be used to select the requested one of the individual data values to generate the start address values for the requested one of the individual data values.

17. A computer-implemented method to access an individual data value in a compressed data structure, the method comprising:

generating a binary sequence corresponding to zero entries and non-zero entries of an uncompressed data structure;

generate a value map from the binary sequence, the value map appended to the compressed data structure and including binary placeholders for the binary sequence, each respective binary placeholder including a respective value of zero or one corresponding to a respective zero entry or non-zero entry of the uncompressed data structure;

arranging a value map in individually selectable fields, the individually selectable fields corresponding to individual data values from a compressed data structure, the value map including address offsets for the respective non-zero entries of the uncompressed data structure;

generating start address values for the individually selectable fields;

masking unrequired fields identified by respective on-cs of the binary placeholders associated with requested ones of the individual data values; and associating the requested one of the individual data values with a corresponding one of the start address values to retrieve the requested one of the individual data values from the compressed data structure without decompressing remaining data values in the compressed data structure.

18. The computer-implemented method as defined in claim 17, wherein the value map includes a base address value associated with the uncompressed data structure.

19. The computer-implemented method as defined in claim 17, further including sequentially applying address values of the value map to generate a random access memory (RAM) address for the requested one of the individual data values.

20. The computer-implemented method as defined in claim 17, wherein the non zero value memory positions are associated with memory having at least one of an integer value or a floating-point value.

21. The computer-implemented method as defined in claim 17, wherein the value map includes address offsets only for associated non zero value memory positions.

22. The computer-implemented method as defined in claim 17, further including invoking at least one of a load instruction or a save instruction with an instruction set architecture.

23. The computer-implemented method as defined in claim 17, further including:

counting a number of non zero data values that precede the requested one of the individual data values; and adding the number as a base address offset to be used to select the requested one of the individual data values.

\* \* \* \* \*